United States Patent
Roithmeier

(10) Patent No.: US 7,795,985 B2
(45) Date of Patent: Sep. 14, 2010

(54) CLOCK CONTROL FOR DATA SYNCHRONIZATION IN VARACTOR ARRAYS

(75) Inventor: Andreas Roithmeier, Munich (DE)

(73) Assignee: Infineon Technologies AG, Neubiberg (DE)

( * ) Notice: Subject to any disclaimer, the term of this patent is extended or adjusted under 35 U.S.C. 154(b) by 123 days.

(21) Appl. No.: 12/272,084

(22) Filed: Nov. 17, 2008

(65) Prior Publication Data

US 2010/0123525 A1 May 20, 2010

(51) Int. Cl.
*H03L 7/099* (2006.01)

(52) U.S. Cl. .................. 331/177 V; 331/36 C; 331/1 A

(58) Field of Classification Search ............ 331/177 V, 331/36 C
See application file for complete search history.

(56) References Cited

U.S. PATENT DOCUMENTS

| | | | | |
|---|---|---|---|---|
| 6,137,372 A | * | 10/2000 | Welland | 331/117 R |
| 6,400,231 B1 | * | 6/2002 | Leduc et al. | 331/116 FE |
| 6,658,748 B1 | * | 12/2003 | Leipold et al. | 331/179 |

\* cited by examiner

*Primary Examiner*—Joseph Chang
(74) *Attorney, Agent, or Firm*—Lee & Hayes, PLLC

(57) ABSTRACT

Implementations of varactor systems compare current data with immediately prior data to determine whether there has been a change in the data, and enable a clock signal for data paths which have changed data.

20 Claims, 7 Drawing Sheets though any devices, such as those that incorporate oscillators, or devices that may be used as communication components may benefit from the disclosed implementations.

CLOCK CONTROL FOR DATA SYNCHRONIZATION IN VARACTOR ARRAYS

BACKGROUND

Digital varactors can be used for a variety of applications in communications and signal processing. For example, digital phase locked loops (PLLs), such as those used for direct carrier frequency synthesis and modulation, may include a number of digital blocks. In some instances of a PLL, the forward path from the phase detector to the oscillator may include a digital loop filter and a digital varactor. Conventionally, a digital varactor can be used to carry out fine-tuning of the oscillator frequency. Additionally, in some systems, there may also be a need for synchronization of the varactor control data.

For controlling synchronization within a digital varactor, gated devices such as latches may be used. For example, the varactor frequency tuning range may typically include the modulation range and can also accommodate other oscillator frequency variations, such as for taking temperature drift into account. Thus, in the digital domain, the varactor needs a certain bit range, which, in a decimal counting scheme, can represent the number of varactor cells. The clock frequency of this digital signal can depend on the dedicated system requirements.

For linearity issues, the varactor cells through which the frequency stepping is carried out can be realized in thermometer-encoded design style. A second issue which can occur in the case of a large modulation bandwidth is that the number of switched thermometer-encoded bits per clock cycle is typically limited to a small number. The reason for this limitation is a high ratio of the clock frequency to the modulation step size per clock cycle, which results in the modulation being fairly low in frequency in comparison to the varactor clock frequency.

The number of latches (gated devices) used typically correlates to the number of individual varactors which are used in the digital varactor unit, which can be a relatively high number. Further, for each clock cycle, all the latches are typically driven with the same clock signal. The cycling of the latches with each clock signal can result in relatively high power consumption, with all the drawbacks that entails. On the other hand, only a small number of the varactors actually need to be switched during any specific clock cycle because of oversampling from the clock frequency with respect to the modulation bandwidth.

The inventor has determined that the conventional technique leads to unnecessarily high power consumption because all the latches are cycled with each clock cycle, even if there is no change in the data for a particular varactor cell from one cycle to the next. This high power consumption can cause large current peaks as a result of the charging and discharging activities due to the clock signal. Furthermore, such current peaks can create supply ripples and supply drops, which can disturb the oscillator signal. Additionally, with an increased number of latches and/or an increased clock frequency, the charge fluctuations will increase. Higher charge fluctuations will consequently cause higher supply currents, which can cause the supply ripples to also increase. Thus, one deleterious effect of the conventional technique is an increase in the spurious level at the oscillator output signal. A second detrimental effect of the conventional technique is that the overall power consumption is large, and increases as the number of latches increases. For example, one application of in which varactors may be implemented is for use in battery-powered cellular telephones, where it is desirable to lower power consumption whenever possible. A third undesirable effect is that a large supply ripple can distort the varactor array itself. This can degrade the PLL performance due to negative effects on the varactor's linearity.

BRIEF DESCRIPTION OF THE DRAWINGS

The accompanying drawing figures, in conjunction with the general description given above, and the detailed description of the implementations given below, serve to illustrate and explain the principles of the implementations of the best mode presently contemplated. In the figures, the left-most digit(s) of a reference number identifies the figure in which the reference number first appears. In the drawings, like numerals describe substantially similar features and components throughout the several views.

DETAILED DESCRIPTION

Figure 1:
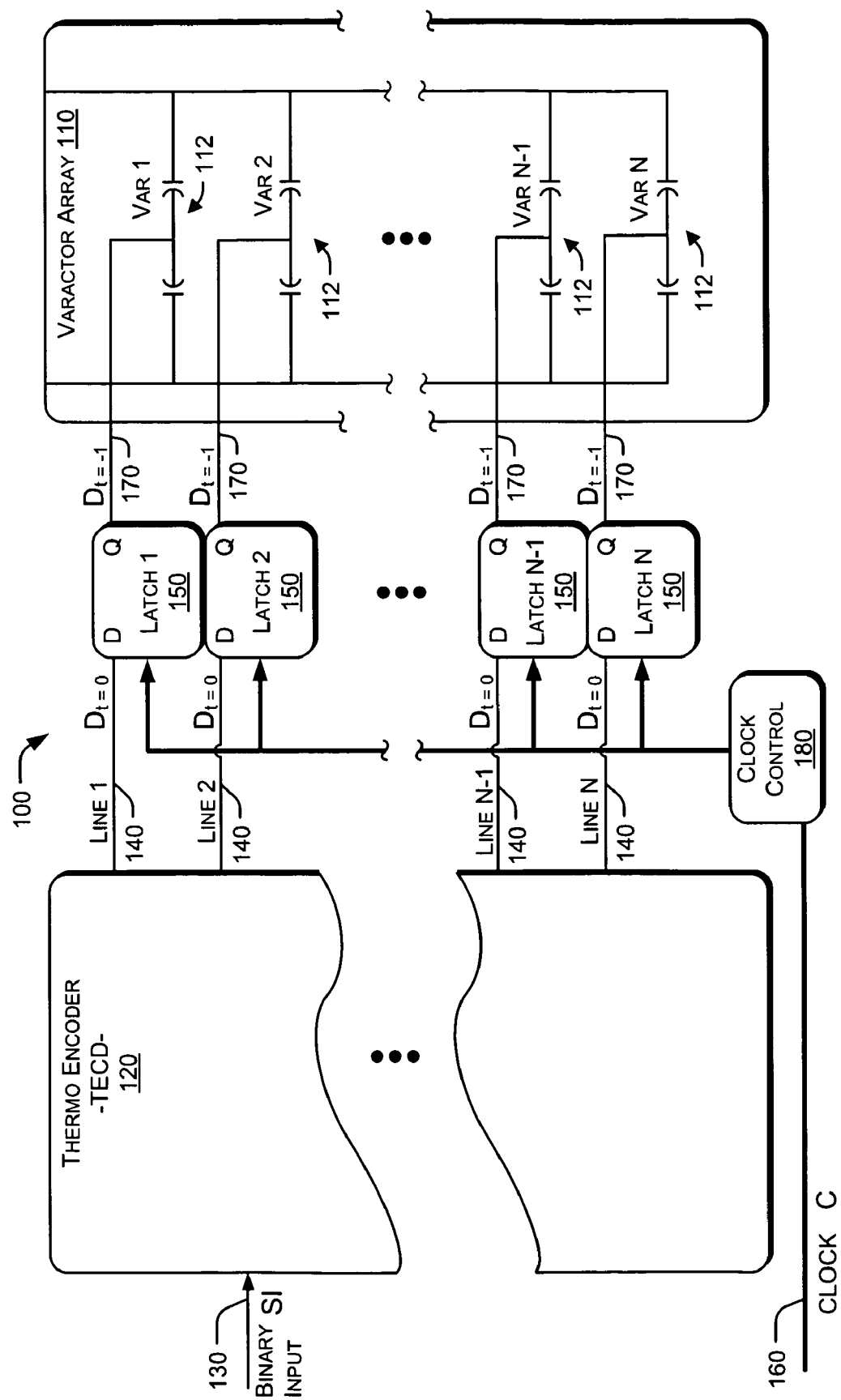
FIG. 1 illustrates an exemplary system in which some implementations of the disclosure may be realized.

In the following detailed description, reference is made to the accompanying drawings which form a part of the disclosure, and in which are shown by way of illustration, and not of limitation, exemplary implementations. Further, it should be noted that while the detailed description provides various exemplary implementations, as described below and as illustrated in the drawings, this patent is not limited to the implementations described and illustrated herein, but can extend to other implementations, as would be known or as would become known to those skilled in the art. Reference in the specification to "one implementation", "this implementation" or "these implementations" means that a particular feature, structure, or characteristic described in connection with the implementations is included in at least one implementation, and the appearances of these phrases in various places in the specification are not necessarily all referring to the same implementation. Additionally, in the following detailed description, numerous specific details are set forth in order to provide a thorough disclosure. However, it will be apparent to one of ordinary skill in the art that these specific details may not all be needed in all implementations. In other circumstances, well-known structures, materials, circuits, processes and interfaces have not been described in detail, and/or may be illustrated in block diagram form, so as to not unnecessarily obscure the disclosure.

This disclosure includes various arrangements and techniques for conserving power by clocking only the data synchronization paths to a digital varactor where changes occur. For example, disclosed techniques involve implementing clock control for carrying out the data synchronization. Disclosed exemplary arrangements can be implemented in a variety of electronic or communication devices or other systems that may require digital varactor arrays. Devices that can benefit from the disclosed implementations include, but are not limited to, communication devices and mobile phones, such as GSM (Global System for Mobile communications) or UMTS (Universal Mobile Telecommunications System). Further, while the following systems and methods are described with reference to a varactor array, such as for use in a mobile communication device, it will be appreciated that the disclosed techniques and circuits can be implemented generally in any similar electronic/communication system.

Exemplary implementations, as will be described in greater detail below, may use a feedback signal to implement clock control for synchronizing data signals. Thus, in exemplary implementations, clocking of all latches for a varactor array is not necessary. Additionally, exemplary implementations include grouping or bundling of lines and latches so that the number of clock control blocks required can be reduced. For example, in some implementations, to realize reduced power consumption, the number of clock control blocks is optimized based upon optimization calculations. With the implementations set forth in this disclosure, a clock control scheme is developed with the aim of reducing the number of devices clocked or cycled at each dedicated clock cycle.

FIG. 1 illustrates an example of an arrangement for a digital varactor system 100 in which implementations of the disclosure may be applied. In the varactor system 100 illustrated in FIG. 1, a varactor array block 110 is made up of a plurality of individual varactors 112 (V$_{AR}$ 1 through V$_{AR}$ N). A thermometer encoder block 120 receives an input signal SI, which may be a binary signal, on an input path 130, and outputs 1 through thermometer encoded binary values as data $D_{t=0}$ for a particular clock cycle based on the binary signal SI to a plurality of latch input lines 140 (Line 1 through Line N). Latch input lines 140 are each connected from the thermometer encoder block 120 to a corresponding gated latch 150 (Latch 1 through Latch N), or similar device, which controls passage of the thermo-encoded signal data $D_{t=0}$ to the varactor array 110. Also connected to the latches 150 is a clock signal line 160 for delivering a clock signal C for cycling the latches 150 for synchronizing the thermo-encoded signal data $D_{t=0}$ for delivery to the varactor array 110. Latch output lines 170 each correspond to one of latch input lines 140, and connect each latch 150 to a corresponding varactor 112 in varactor array 110 for receiving the thermometer encoded binary input signal data $D_{t=-1}$ at the varactors 112 corresponding to the immediately-preceding clock cycle.

As an example, the binary input signal SI that is fed to thermo encoder block 120 may be a binary weighted data signal. The thermo-encoded data $D_{t=0}$ exiting thermo encoder 120 via lines 140 is synchronized by the clock signal C delivered by clock line 160. This synchronization is carried out by latches 150 in accordance with the clock signal C delivered to the latches 150. Thus, the clock signal C toggles or cycles the latches for enabling or disabling passage of the thermo-encoded data on lines 140, 170 to the varactors 112 in varactor array 110. A clock control block 180 is implemented to control the clocking of latches 150. Without the clock control block 180, all the latches 150 might be cycled with each clock cycle. However, by implementation of a clock control block 180, the clocking of the latches can be controlled so that only some latches are clocked with each clock cycle. For example, in some implementations, only latches corresponding to lines on which the data has changed are cycled. In other implementations, lines, latches and varactors may be grouped into groups or bundles so that only latches in some of the groups might be cycled during any particular clock cycle. These and other implementations are explained additionally below.

Figure 2A:
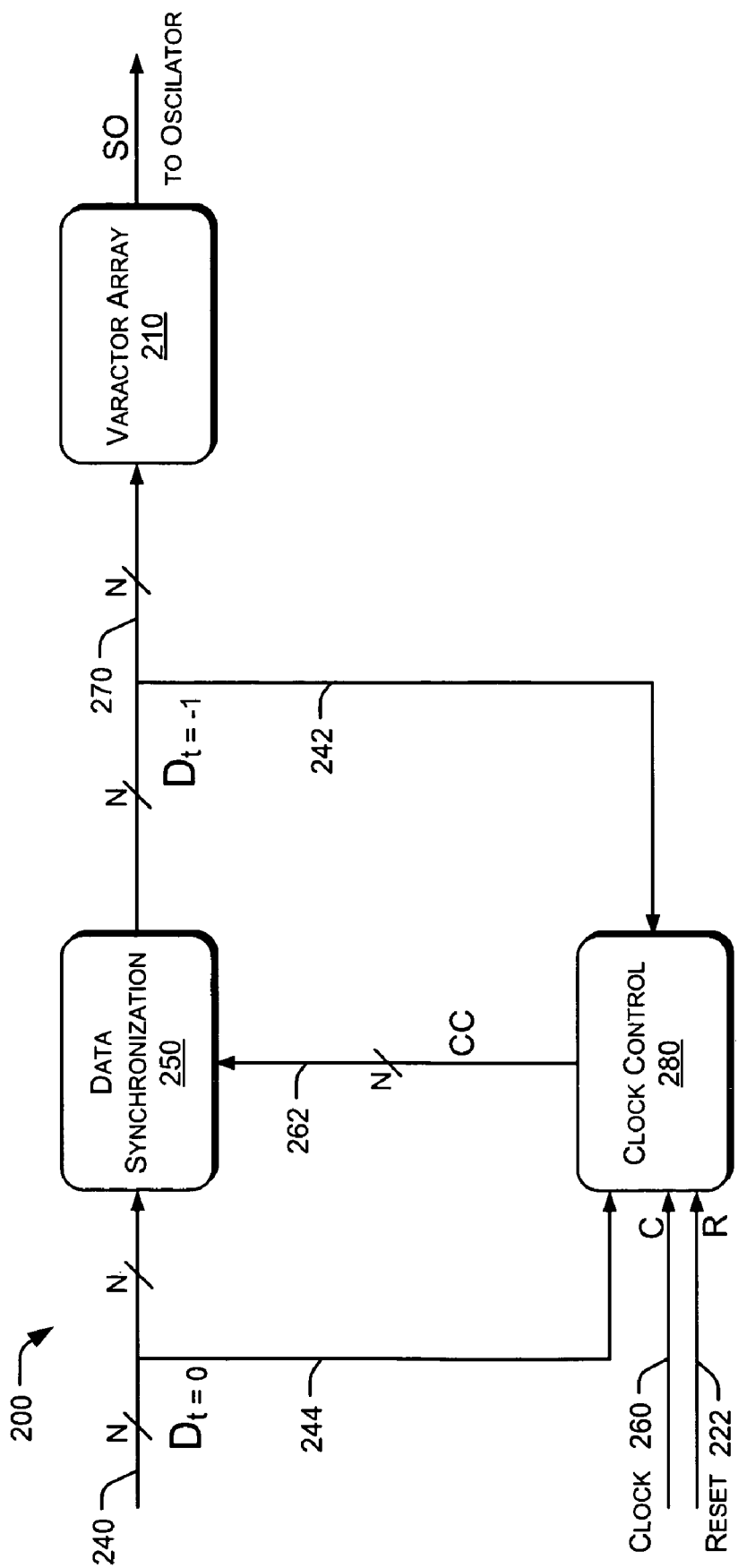
FIG. 2A illustrates an exemplary implementation of the disclosure that includes clock control.

FIG. 2A illustrates a block diagram of an exemplary varactor system 200 for implementation of clock control for synchronization of data paths to a varactor array 210. Varactor system 200 includes a data input line 240 carrying a data signal $D_{t=0}$, which may be a digital data signal, to a data synchronization block 250, which may be an array of one or more latches, or the like. The data signal $D_{t=0}$ is also delivered to a clock control block 280 via a clock control input line 244. A clock signal line 260 and a reset signal line 222 are also connected to clock control block 280 for delivering a clock signal C and a reset signal R, respectively. A feedback line 242 provides a path to clock control block 280 from the data synchronization output line 270 that delivers the synchronized data signal $D_{t=-1}$ to the digital varactor array 210. A clock control output line 262 delivers a clock control signal CC from clock control block 280 to data synchronization block 250 when the data at time t=0 is different from the data at time t=−1. Further, it should be noted that while a single input line 230 is illustrated, the "N" indicates that there may be a plurality of input lines 230 to data synchronization block 250, a plurality of corresponding data synchronization output lines 270, clock control input lines 244, feedback lines 242, clock control blocks 280, and clock control output lines 262, so that a plurality of data signals to varactor array 210 can be synchronized using the clock signal C and clock control block 280, as discussed below.

In the implementation of FIG. 2A, the data synchronization path is cycled by the clock signal C only when changes occur in the data synchronization path. To determine when the data path will have changes, the current data word at t=0 and the immediately prior data word at t=−1 can be compared. The data comparison is carried out by clock control block 280, which then feeds the clock control signal CC (corresponding to the clock signal C) to the corresponding data synchronization block 250 via clock control output line 262. In some implementations, the data comparison is carried out with an exclusive OR (EXOR) element or other suitable comparison block, which detects whether the two data signals $D_{t=0}$ and $D_{t=-1}$ are equal or different. Additionally, to ensure a proper setting of all data at a first point in time, such as t=−1, a reset of the clock control block 280 may first be carried out by sending a reset signal R on reset line 222 to clock control block 280 when starting synchronization of data at the first point in time, such as during power up of the system, or the like. This ensures that the first data input is accurately passed to the varactor array 210.

As an example of operation, following the initial reset of the clock control block 280, and the processing of data $D_{t=-1}$ corresponding to time t=−1, then, at time t=0 the data on data line 240 is set to the new current data value $D_{t=0}$. At the same time, following the data synchronization in data synchronization block 250, the immediately prior data value $D_{t=-1}$ from time t=−1 is still available. The data $D_{t=0}$ of time t=0 and data $D_{t=-1}$ of time t=−1 are fed to clock control block 280 via clock control data line 244 and feedback line 242, respectively. In the clock control block 280, the data $D_{t=0}$ corresponding to time t=0 is compared with the data $D_{t=-1}$ corresponding to time t=−1 to determine whether the data has changed. For example, in the case of binary data, the data may be either a "0" or a "1". The clock signal C is passed to the data synchronization block as clock control signal CC only when the clock control block 280 detects that data $D_{t=0}$ is different from data $D_{t=-1}$, so that only when the data is different is the data signal $D_{t=0}$ fed through to varactor array 210. Subsequently, during the next clock cycle, at time t=1, the data $D_{t=0}$ is fed back to clock control 280 via feedback line 242 and compared with data $D_{t=-1}$ to determine whether there has been a change, and only when there has been a change is clock signal C sent to data synchronization block 250 via clock control output line 262 as clock control signal CC. Thus, the data received at data input line 240 can be continually processed in this manner for each point in time, such as for each clock cycle received through clock signal line 260.

Figure 2B:
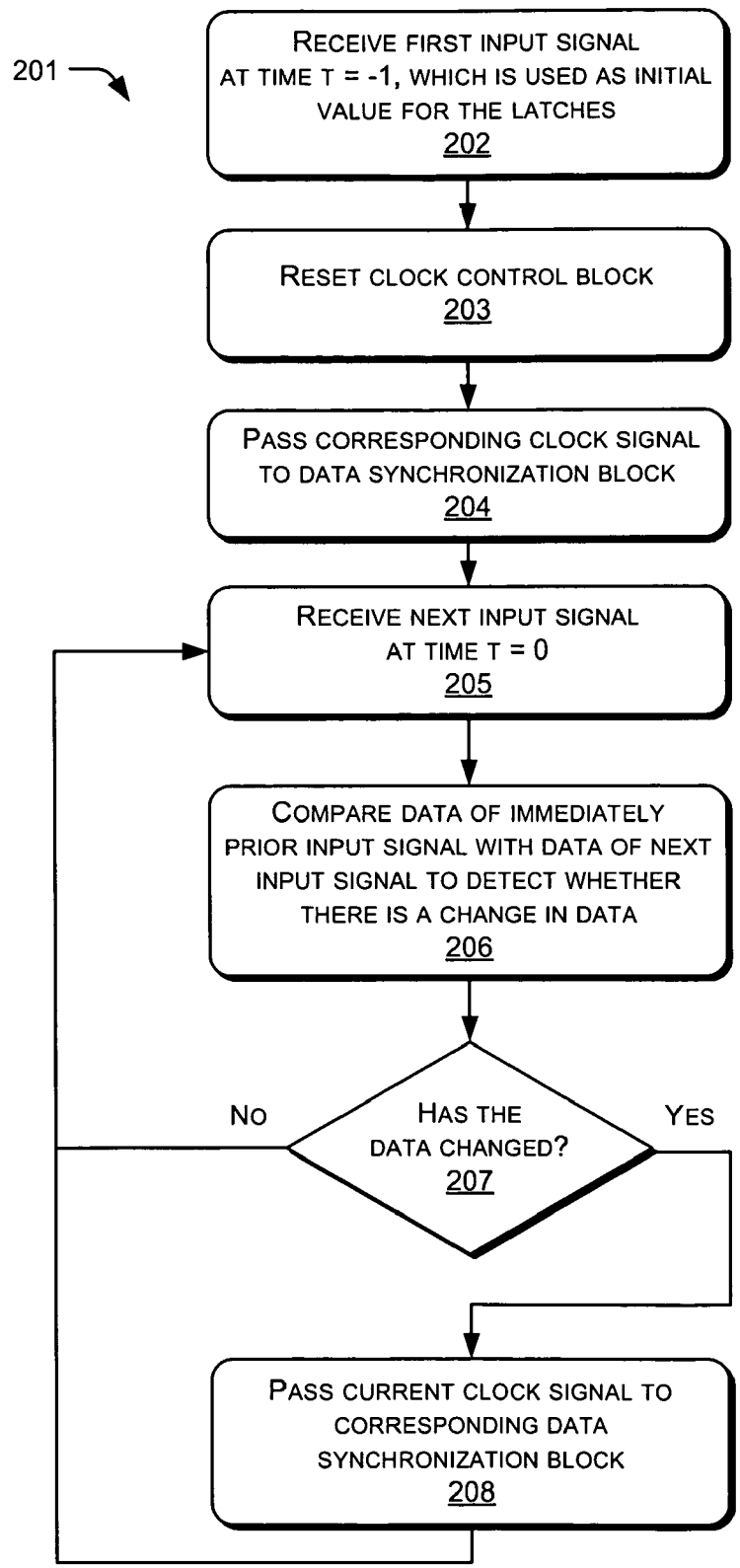
FIG. 2B illustrates a flowchart of an exemplary process for realizing clock control in a varactor system.

FIG. 2B is a flowchart illustrating an exemplary method 201 for reducing current consumption in varactor systems, or the like. The method introduced may, but is not required to, be implemented at least partially in architectures such as illustrated in FIGS. 1, 2A, 3A-3B, 4 and 5; however, for clarity of explanation, the method will be described relative to the structure set forth in FIG. 2A. The order in which the method below is described is not intended to be construed as a limitation, and any number of the described method blocks can be combined in any order to implement the method, or an alternate method. Thus, it is to be appreciated that certain acts in the method need not be performed in the order described, may be modified, and/or may be omitted entirely. Additionally, individual blocks may be deleted from the method without departing from the spirit and scope of the subject matter described herein. Furthermore, the method can be implemented in any suitable hardware, firmware, or a combination thereof.

At block 202, a first input signal is received and processed at a time t=−1 at the data synchronization block and the clock control block.

At block 203, a reset of the clock control block is performed, after power up, to ensure that the initial data value is taken over properly at the latch output.

At block 204, the corresponding clock signal is passed to the data synchronization block for clocking the data synchronization block.

At block 205, the next input signal is received at a time t=0 at the data synchronization block and the clock control block.

At block 206, the data of the immediately prior input signal is compared with the data of the current input signal to determine whether the data has changed between time t=0 and time t=−1.

At block 207, when there has been no change in the data, the process returns to block 205 to receive the next input signal during the next clock cycle. However, when the data has changed, the process goes to block 208.

At block 208, when a change in data is detected, the current clock signal is passed to the data synchronization block for clocking the data synchronization block in association with the current input signal. Following this step, the process goes back to block 205 to process the next input signal for the next clock cycle.

Figure 3A:
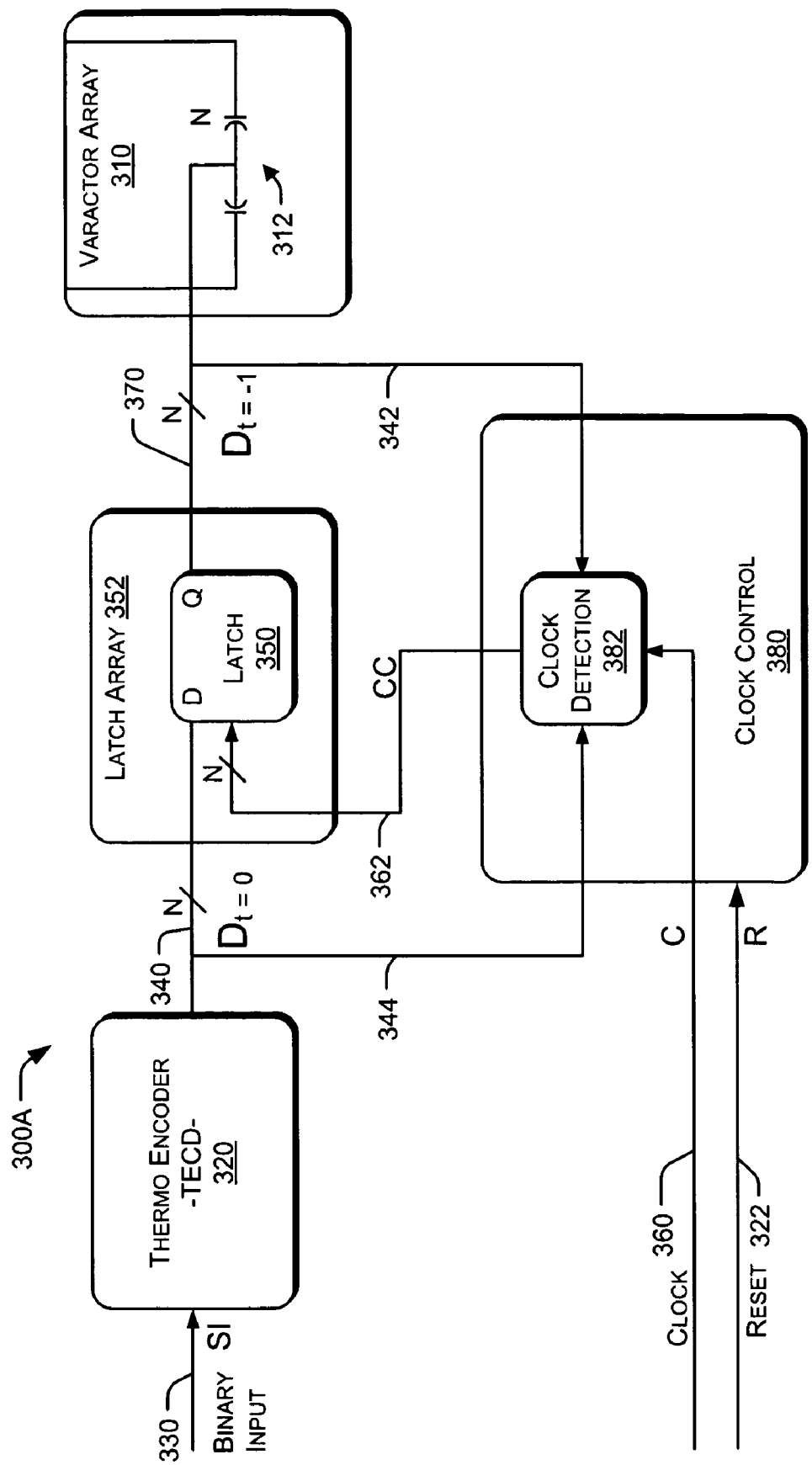
FIGS. 3A and 3B illustrate other exemplary implementations of varactor systems realizing clock control.
Figure 3B:
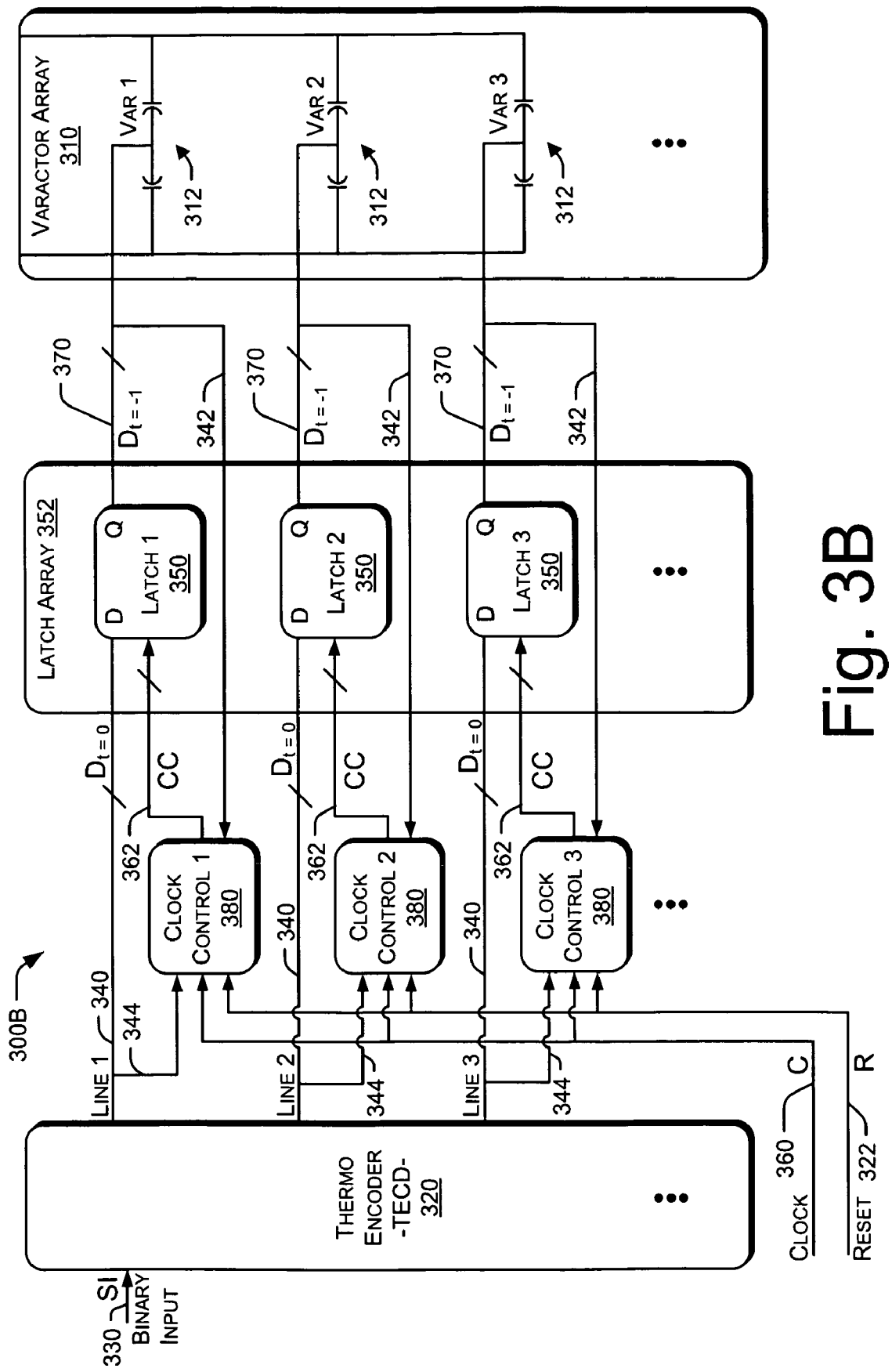

FIGS. 3A and 3B illustrate additional implementations of varactor systems 300A and 300B, respectively. In the implementation of FIG. 3A, varactor system 300A includes a binary input line 330 that inputs a data input signal SI, which may be binary weighted data, such as a binary word, to a thermometer encoder block 320. A latch input line 340 is connected from thermo encoder block 320 to a gated latch 350 in a latch array 352 containing one or more latches 350, and transfers thermo-encoded data $D_{t=0}$ from the thermo encoder block 320 to the latches 350. An output line 370 is connected from latch 350 to a varactor 312 in a varactor array 310 containing one or more varactors 312. A clock control input line 344 also inputs data $D_{t=0}$ at time t=0 into a clock control block 380. A feedback line 342 inputs data $D_{t=-1}$ at time t=−1 into clock control block from output line 370. Clock control block 380 includes a clock detection block 382 that compares the data $D_{t=0}$ with data $D_{t=-1}$ to determine whether a clock signal C should be delivered to latch 350 as clock control signal CC via a clock control output line 362. As an example, in some implementations, an EXOR logical element can be used to determine if the data of $D_{t=0}$ and $D_{t=-1}$ are different from each other, although other known comparison elements may alternatively be used. A clock line 360 delivers the clock signal C to clock control block 380, and a reset line 322 delivers a reset signal R, such as during initiation of the system.

FIG. 3B illustrates the implementation of FIG. 3A in which there are a plurality of latch input lines 340 exiting thermo encoder block 320 for connection to corresponding latches 350. In FIG. 3B lines 1-3 are illustrated, with it being understood that there may be any "N" number of lines, depending on the number of bits to be used in the binary input. For example, for a 7-bit binary input signal SI, there would typically be 127 latch lines 340 exiting thermo encoder block 320, and a corresponding number of latches 350 and varactors 312. However, the disclosure is not limited to any particular number of lines, latches or varactors. For each latch input line 340 exiting thermo encoder block 320, there is a corresponding latch 350, varactor input line 370, varactor 312, clock control block 380, clock control input line 344, feedback line 342, and clock control output line 362, as illustrated in FIG. 3B.

In the implementations of FIGS. 3A and 3B, a loop filter output signal may be fed as binary input signal SI to the digital varactor system 300 through input line 330. Full thermometer encoding of the binary-weighted input signal is carried out in the thermo encoder block 320. Thermometer encoding is a conventional technique known in the art, and therefore will not be described further. For achieving synchronization following the thermo encoder block 320 the thermo-encoded data $D_{t=0}$ on latch input lines 340 is gated by the latches 350. The synchronized output data signal $D_{t=-1}$ that is output from the latches 350 is then delivered via lines 370 to control varactors 312 in varactor array 310.

As in the system 200 described above with reference to FIG. 2, the data $D_{t=0}$ corresponding to time t=0 and the data $D_{t=-1}$ corresponding to time t=−1 are both made available to clock detection block 382 in the clock control block 380. The clock detection block 382 determines whether the data at the corresponding latch 350 will change with the current clock cycle by comparing the data $D_{t=0}$ at the current clock cycle with the data $D_{t=-1}$ of the immediately-prior clock cycle. As discussed above, the comparison may be carried out using an XOR block or other suitable comparison element. When the data does not change from one clock cycle to the next, the clock signal C is not delivered to the specific corresponding latch 350, but when the data does change, the clock signal C is delivered as clock control signal CC via clock control line 362 to the corresponding latch 350. For example, the data delivered on each latch input line 340 would typically be a digital signal corresponding to a "0" or a "1". A signal corresponding to a "0", when delivered to one of varactors 312 results in a first capacitance, while a signal corresponding to a "1", when delivered to the varactor 312 results in a second capacitance. When the corresponding latch 350 is not cycled by the clock control signal CC, the capacitance of the varactor 312 for the previous cycle is maintained.

One of the benefits of the implementations of FIG. 2 and FIGS. 3A-3B is the simple structure on a block level. However, these implementations may have a high complexity on a schematic level when there are a large number of gates, such as when there are a large number of latch input lines 340 exiting thermo encoder block 320. For, example, in some implementations, there may be 127 latch input lines 340, and 127 corresponding latches 350 and clock control blocks 380. This can result in increased complexity and a significant increase in the area required for the circuitry, which can partially negate the power savings. The disclosure is not limited to any particular thermo encoder configuration or any particular number of latch input lines, latches, varactors, or the like.

Figure 4:
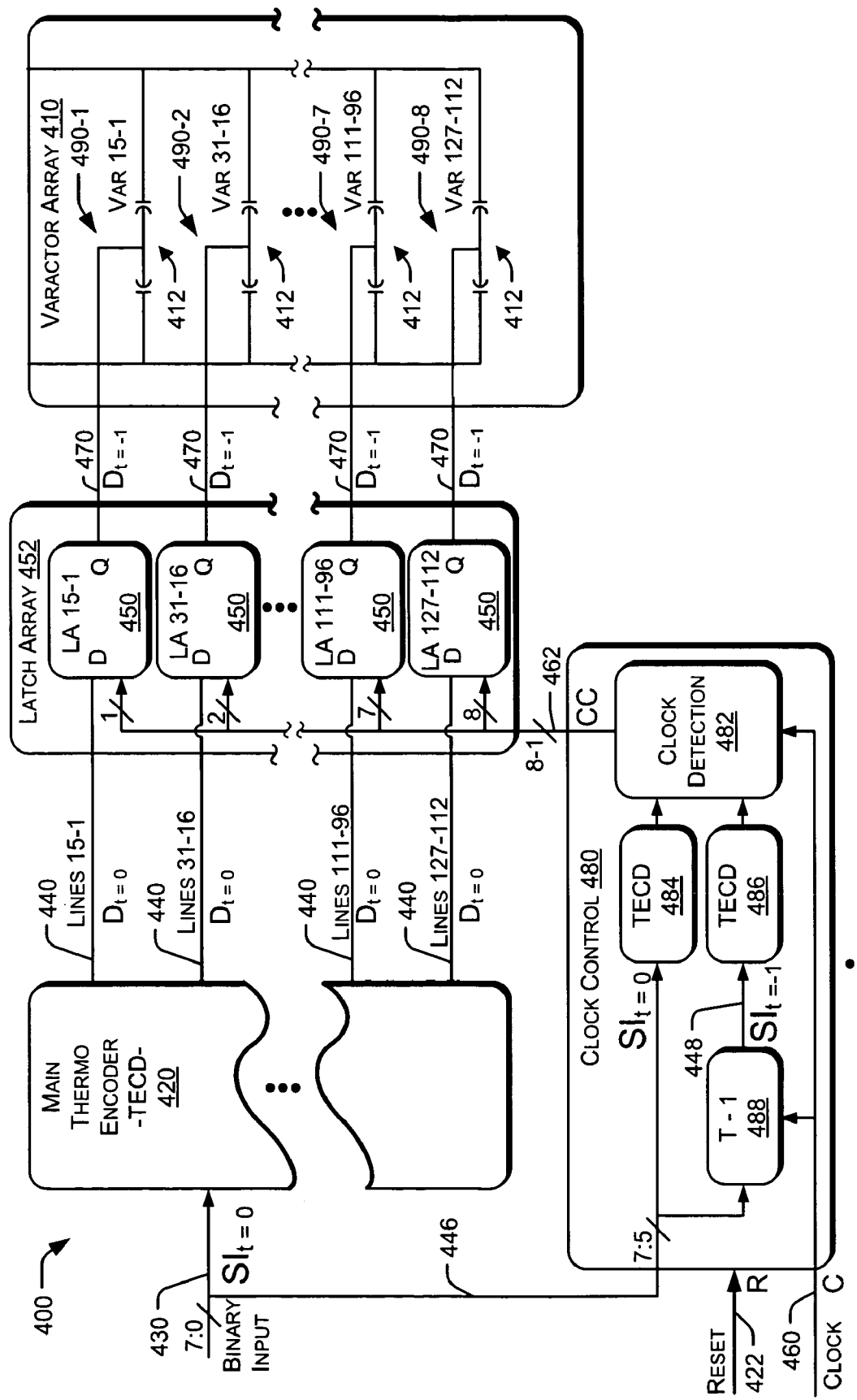
FIG. 4 illustrates an alternative exemplary implementation including grouping of data paths.

FIG. 4 illustrates a block diagram of an alternative implementation of a digital varactor system 400, which overcomes possible drawbacks of the implementations of FIGS. 3A and 3B discussed above. The exemplary implementation illustrated in FIG. 4, including the bit width of the digital varactor and the particular partitioning used are only specific examples of various possible implementations. In reality a number of different possible implementations are available, as will be apparent in view of the disclosure herein, depending on input bit width, technology used, layout floor plan, area requirements, and the like.

In the implementation illustrated in FIG. 4, a main thermometer encoder block 420 includes an input line 430 and may be configured to receive a loop filter output signal as a binary input via input line 430. In the example illustrated, main thermo encoder block 420 is configured to receive a 7-bit word as an input, resulting in 127 latch input lines 440 exiting thermo encoder block 420. These latch input lines 440 each deliver a corresponding thermo-encoded data signal $D_{t=0}$ to a corresponding latch 450 in a latch array 452 for synchronization by clock signal 460. Following synchronization, the data passing through latches 450 is delivered to a corresponding varactor 412 in a varactor array 410 via a corresponding latch output line 470.

In these implementations, the latch input lines 440, latches 450, latch output lines 470, and varactors 412 are grouped or bundled into a plurality of groups 490. Through grouping of the latches and varactors, the amount of clock control required can be reduced, such that the clocking of the latches is controlled according to each group 490 of latches and varactors, rather than for individual latches. In the implementation illustrated in FIG. 4, there are eight bundles or groups 490-1 through 490-8 of latches and corresponding varactors, in which a first group 490-1 is made up of latch input lines 1-15, latches 1-15, latch output lines 1-15, and varactors V$_{AR}$ 1 through V$_{AR}$ 15; a second group 490-2 is made up of latch input lines 16-31, latches 16-31, latch output lines 16-31, and varactors V$_{AR}$ 16 through V$_{AR}$ 31; a third group 490-3 (not shown) is made up of latch input lines 32-47, latches 32-47, latch output lines 32-47, and varactors V$_{AR}$ 32 through V$_{AR}$ 47; a fourth group 490-4 (not shown) is made up of latch input lines 48-63, latches 48-63, latch output lines 48-63, and varactors V$_{AR}$ 48 through V$_{AR}$ 63; a fifth group 490-5 (not shown) is made up of latch input lines 64-79, latches 64-79, latch output lines 64-79, and varactors V$_{AR}$ 64 through V$_{AR}$ 79; a sixth group 490-6 (not shown) is made up of latch input lines 80-95, latches 80-95, latch output lines 80-95, and varactors V$_{AR}$ 80 through V$_{AR}$ 95; a seventh group 490-7 is made up of latch input lines 96-111, latches 96-111, latch output lines 96-111, and varactors V$_{AR}$ 96 through V$_{AR}$ 111; and an eighth group 490-8 is made up of latch input lines 112-127, latches 112-127, latch output lines 112-127, and varactors V$_{AR}$ 112 through V$_{AR}$ 127. Further, it should be understood that while only one latch input line 440, latch 450, latch output line 470 and varactor 412 are illustrated for each group 490, in implementations of the actual circuit there are an individual latch input line 440, latch 450, latch output line 470 and varactor 412 corresponding to each of the lines 1-127. Additionally, while the illustrated implementation includes eight groups 490, as will be discussed further below, the number of groups 490 may be varied based upon a determined optimum number of groups 490 for a particular system arrangement.

In the illustrated implementation of FIG. 4, a clock control block 480 is included that receives the current binary input signal $SI_{t=0}$ as an input via clock control input line 446. The current input signal $SI_{t=0}$ is also delivered to main thermo encoder block 420, as in the implementations described above. One clock control block 480 is included for controlling the clock control signal CC to each group of latches 450 as grouped according to the groups 490, i.e., there is a clock control block 480 for controlling delivery of a clock control signal CC to each group 490. For these implementations, clock control block 480 includes a first secondary thermometer encoder block 484 for receiving the current input signal $SI_{t=0}$ and a second secondary thermometer encoder block 486 for receiving the immediately-previous input signal $SI_{t=-1}$ via a previous data line 448. Previous data line 448 includes a storage block 488 that stores the data from time t=−1 for one clock cycle. In some implementations, storage block 488 may be a flip-flop circuit. Additionally, in order to reduce the size of the first and second thermo encoder blocks 484, 486 in clock control block 480, only the three most significant bits (MSBs) of the input signals $SI_{t=0}$, $SI_{t=-1}$ may be used. Thus, in parallel paths, the three MSBs of the binary data words from clock cycle t=0 and clock cycle t=−1 are separately thermo encoded by the first thermo encoder block 484 and the second thermo encoder block 486, respectively. In these implementations, the three MSBs act like a pointer. The decimal value of the three MSBs is an indication at which of the groups 490 the varactor value changes from high to low. The clock detection block 482 can be arranged to carry out three different tasks. First, clock detection block 482 can detect which group 490 is the high-to-low crossing of the varactor values for the immediately-previous data at time t=−1, and passes the clock control signal CC to the latches 450 which correspond to this group 490 where the high to low crossing occurs. Secondly, clock detection block 482 detects which group 490 is the high-to-low crossing for the new data of time t=0. In the case that these are two different groups 490 then the clock control signal CC is passed to the latches 450 which correspond to these two groups 490 where the high to low crossing occur. Thirdly, the clock detection block 482 detects whether the group 490 with the immediately-previous high-to-low crossing is right next to the group 490 with the new high-to-low crossing. If not, the corresponding detection block 482 also enables the clock control signal CC to the latches 450 corresponding to the groups 490 between the immediately-previous group 490 having the high-to-low crossing and new group 490 having the high-to-low crossing. All this functionality can be done for example by a proper EXOR comparison of the immediately-previous data of time t=−1 and the new data of time t=0, with an OR operation afterwards. Clock detection block 482 then compares the output of the first thermo encoder block 484 with the output of the second thermo encoder block 486 in the clock control unit and passes the clock control signal CC only on the clock control output lines 462 to the latches 450 of any groups 490 where a change of data has occurred.

In this implementation, with partitioning of the latches 450, lines 440, 470 and varactors 412 into eight groups 490, then eight parallel clock control blocks 480 are used in the implementation of FIG. 4. Therefore, one clock control block 480 determines whether the data has changed for any of latch input lines 440 in group 1 (lines 1-15), a second clock control block 480 determines whether the data has changed for any of latch input lines 440 in group 2 (lines 16-31), and so forth for each of the eight groups 490 of 16 latches (or 15 latches in the case of the first group 490-1). Further, while only a single clock control output line 462 is illustrated, it should be understood that there is a clock control output line 462 connected to each of the latches 450 from the corresponding clock control block 480, and that the corresponding clock control block 480 for each group 490 is able to send a clock control signal CC to the latches 450 of the corresponding group 490. Thus, in this implementation, the clock control signal CC to the latches 450 is enabled or not enabled for all the latches in each group 490 of 16 latches.

According to the implementation of FIG. 4, some additional area and current is required by the clock control blocks 480, but there will be a substantial decrease in the amount of current used by the latches 450. In order to optimize the design, a determination can be made as to an optimal number of latches and varactors (branches) to include in each group 1-8, and thereby, an optimal number of clock control blocks 480. For example in the implementation of FIG. 4, it would be possible to include 1, 2, 4, 8, 16, 32 or 64 latches in each group 490. In the implementation of FIG. 4, the optimal number of latches and varactors in each group 490 has been determined to be 16.

This optimization can be carried out based on the following equation:

$$I\_sum = A*2^b + 2L*b + N*L*2^{(-b)}$$

where the symbol explanation is as follows:

I_sum=overall current consumption (normalized to current consumption of one gated transistor)

A=sum of current consumption of all gated transistors within one "AND" logic device b=number of groups 490 into which are the latch array is divided expressed as an exponent to the base of 2 (b is also equal to the decimal bit width of the clock control input)

N=decimal bit width of input=number of varactors

L=sum of current consumption of all gated transistors within one latch

For simplification of the I_sum calculation, the current consumption of following blocks is neglected:

Thermo encoders;

Additional line driver devices for data and clock lines;

Current consumption cause by line parasitic capacitors; and

Current consumption thru data change within the latches.

Additionally, in the following calculations, the following symbols are used:

G=unit current consumption of one clocked gated transistor (no difference is considered between P/NMOS)

FF=sum of current consumption of all gated transistors within two latches (flip-flop)

I_L=current consumption of one latch (normalized to current consumption of one gate)

I_FF=current consumption of one flip flop (normalized to current consumption of one gate)

I_A=current consumption of one "AND" (normalized to current consumption of one gate)

The following calculation includes only current consumption forced through the clock signal. The overall current consumption is calculated as follows:

$$I\_L = (N*L)/2^b$$

$$I\_FF = FF = 2L*b$$

$$I\_A = A*2^b$$

$$I\_sum = I\_A + I\_FF + I\_L$$

$$I\_sum = A*2^b + 2L*b + NL*2^{(-b)}$$

or $$I\_sum = 2G*2^b + 12G*b + 768G*2^{(-b)}$$

The goal is to minimize current consumption. The easiest way to accomplish this is by using an iterative solution instead of the analytic one. Thus, corresponding to the implementation illustrated in FIG. 4:

N=127

L=6G

A=2G $$I\_sum = (2 \times 2^b + 12 \times b + 768 \times 2^{(-b)}) \times G$$

For different values of b, the results are set forth as follows:

| b | I_sum(G) |
|---|---|
| 0 | 768 |
| 1 | 408 |
| 2 | 224 |
| 3 | 148 |
| 4 | 128 |
| 5 | 148 |

The above results demonstrate that, for this example, the minimum current consumption is achieved when b=4. However, with each increment of b the size of the first and second thermo encoder blocks 484, 486 within the clock control block 480 doubles. This doubling in size of the thermo encoder blocks 484, 486 also causes doubling of the current consumption of these thermo encoders. Taking this into account, the optimal choice for b is b=3, rather than b=4 because the moderate increase in current savings does not offset the doubling in size of the thermo encoder blocks 484, 486.

The systems and methods disclosed herein for saving current can also be applied to other digital varactor structures. For example, implementations may also be adapted to a matrix style varactor design. A matrix style varactor may include a clocked row and column decoder for transferring a binary input signal in a matrix style data structure.

Figure 5:
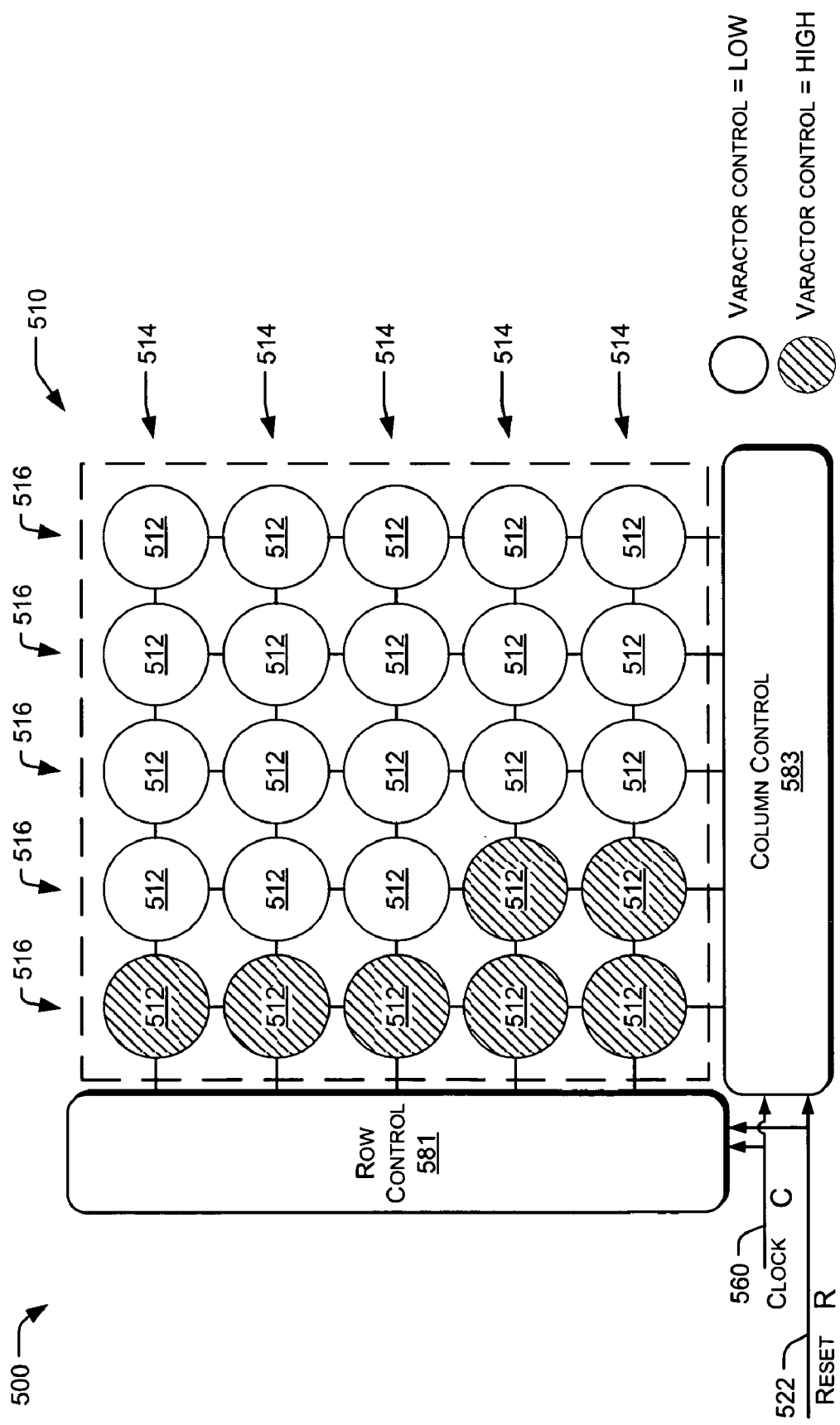
FIG. 5 illustrates yet another exemplary implementation that includes row and column control in a matrix style varactor system.

FIG. 5 illustrates a varactor system 500 including a matrix style varactor array 510 having a plurality of varactors 512 arranged in a plurality of rows 514 and a plurality of columns 516. A row control block 581 controls the varactors 512 according to their row, and a column control block 583 controls the varactors 512 according to their column. Varactors 512 can be operated to have a state of high capacitance, as indicated in the illustrated example by cross-hatching, or a state of low capacitance as indicated by a lack of cross-hatching. Each of the row control block 581 and the column control block 583 includes latches (not shown) for controlling clocking of respective rows or columns of varactors according to input signals received by the control blocks 581, 583, such as from one or more thermo encoder blocks, or the like. Thus, each row 514 and column 516 of FIG. 5 can receive a clocked synchronized data signal from the row control 581 and the column control 583, respectively. Similar to the implementations discussed above with respect to FIGS. 3A-3B and FIG. 4, the row and/or column data of points in time t=0 and t=−1 can be compared using clock control blocks 380 or 480 inside the row control block 581 and the column control block 583. As discussed above, these control blocks 380, 480 enable passage of a clock signal C received through a clock signal line 560 where a data change occurs. A reset signal line 522, as discussed above, may also be included for passage of a reset signal R.

From the foregoing, it may be seen that implementations disclosed herein set forth methods, apparatuses and systems for reducing current consumption in varactor systems. Advantages of the implementations include using data $D_{t=0}$ of a point in time at t=0 (i.e., current data at an input line) and data $D_{t=-1}$ of a point in time t=−1 (i.e., valid varactor data input to a varactor array) within the digital varactor system to enable use of a logic unit (e.g., clock control block 280, 380, 480, 581, 583) to compare the data of t=0 with the data of t=−1 to determine whether there has been a change in the data between time t=0 and time t=−1. The information of the logic unit is used to enable the clock control signal only for the data paths which have changed data. Additionally, implementations include grouping or bundling of data paths, latches and varactors together and using the same clock control signal for all data paths, latches and varactors in the group. In these implementations, only one data change detection unit is used for all the data paths, latches and varactors in a particular group instead of having one for each data path, latch and varactor. This grouping technique reduces circuit complexity and circuitry area of the clock control blocks and detection unit. Thus, for the implementations including grouping of data paths, latches and varactors, the clock control signal to a particular group is only enabled if there is at least one data path in the group that has a data change. To ensure proper initial values, a reset of the clock control block may be implemented before data transfer begins.

Further, it should be noted that the system configurations illustrated in FIGS. 1, 2A, 3A-B, 4 and 5 are purely exemplary of systems in which the implementations may be provided, and the implementations are not limited to a particular hardware configuration. In the description, numerous details are set forth for purposes of explanation in order to provide a thorough understanding of the disclosure. However, it will be apparent to one skilled in the art that not all of these specific details are required.

From the foregoing, it will be apparent that methods, systems and apparatuses for reducing power consumption in varactor systems are provided. Additionally, while specific implementations have been illustrated and described in this specification, those of ordinary skill in the art appreciate that any arrangement that is calculated to achieve the same purpose may be substituted for the specific implementations disclosed. This disclosure is intended to cover any and all adaptations or variations of the disclosed implementations, and it is to be understood that the terms used in the following claims should not be construed to limit this patent to the specific implementations disclosed in the specification. Rather, the scope of this patent is to be determined entirely by the following claims, which are to be construed in accordance with the established doctrines of claim interpretation, along with the full range of equivalents to which such claims are entitled.

What is claimed is:

1. A system comprising:
   a varactor array comprising one or more varactors;
   a data synchronization block in communication with the varactor array via an output line for delivering to the varactor array a first data signal corresponding to a first point in time, the data synchronization block configured to subsequently receive a second data signal corresponding to a second point in time as a subsequent input; and
   at least one clock control block for comparing data of the first data signal with data of the second data signal, said clock control block configured to pass a clock signal to the data synchronization block in connection with the second data signal when data of the second data signal is changed in comparison with data of the first data signal.

2. The system according to claim 1,
   wherein said data synchronization block is a latch array, said latch array including at least one latch, wherein, when the clock signal is passed to the at least one latch, the latch is clocked to enable passage of the second data signal to the varactor array.

3. The system according to claim 1, further comprising:
   a thermometer encoder for receiving a binary input signal and performing thermometer encoding to produce a plurality of encoded output signals, wherein at least one of said encoded output signals is passed to the data synchronization block and the clock control block as said second data signal.

4. The system according to claim 1, further comprising:
   a latch array as said data synchronization block, said latch array including a plurality of latches, each said latch in communication with one of the varactors in the varactor array, said latch being configured to deliver said first data signal corresponding to the first point in time to the varactor, and each said latch configured to receive said second data signal corresponding to the second point in time; and
   a plurality of said clock control blocks, each clock control block corresponding to one of said latches for determining whether to pass a clock signal to a corresponding latch based upon the comparison of the data of the first data signal with the data of the second data signal delivered to the corresponding latch.

5. The system according to claim 4, further comprising:
   a thermometer encoder for receiving a binary input signal and performing thermometer encoding to produce a plurality of encoded output signals, wherein said encoded output signals are passed to the data synchronization block and the clock control block as said first data signals corresponding to said first point in time and said second data signals corresponding said second point in time.

6. The system according to claim 1, further comprising:
   a reset signal line for delivering a reset signal to the clock control block at least during initial power up of the system for ensuring proper clocking of the data synchronization block when receiving the first data signal.

7. The system according to claim 1, further comprising:
   said data synchronization block and said clock control block being configured to receive a third data signal at a third point in time subsequent to said second point in time, said clock control block being configured to compare data of the third data signal with the data of the second data signal, said clock control block being configured to pass a subsequent clock signal to the data synchronization block in connection with the third data signal when the data of the third data is changed when compared with the data of the second data signal.

8. The system according to claim 1, further comprising:
   said varactor array including a plurality of varactors arranged in a matrix having a plurality of rows and a plurality of columns, wherein said clock control block includes at least one clock control block for controlling clock signals for data synchronization to the plurality of rows and at least one clock control block for controlling clock signals for data synchronization to the plurality of columns.

9. The system according to claim 1, further comprising:
   a plurality of latches in said data synchronization block, each said latch connected to a corresponding varactor in the varactor array, said latches being grouped into a plurality of groups, each group comprising a plurality of the latches; and a plurality of said clock control blocks, each corresponding to one of said groups of latches, for determining whether to pass the clock signal to the corresponding group of latches based upon a comparison of the data of the first signal with the data of the second signal.

10. The system according to claim 9, further comprising:
a storage block in each of said plurality of clock control blocks for storing the data of the first data signal to enable comparison of the data of said first data signal with the data of said second data signal.

11. The system according to claim 10, further comprising:
a flip-flop circuit in each of said clock control blocks serving as said storage block for storing the data of the first data signal for one clock cycle to enable comparison of the data of the first data signal with the data of the second data signal.

12. The system according to claim 10, further comprising:
a first thermometer encoder and a second thermometer encoder in each of said clock control blocks for carrying out thermometer encoding of the stored first data signal and the second data signal to enable comparison of the data of said first data signal with the data of said second data signal.

13. A method for operating a varactor system, comprising:
passing a first data signal corresponding to a first point in time from a data synchronization block to a varactor block in connection with a first clock signal;
receiving a second data signal corresponding to a second point in time at the data synchronization block;
comparing data of the second data signal with data of the first data signal to determine whether there is a change; and
sending a second clock signal to the data synchronization block in connection with the second data signal when results of the comparing indicate a change between the data of the first signal and the data of the second signal.

14. The method according to claim 13, further comprising a step of:
resetting a clock control block in the varactor system prior to receiving the first data signal at the data synchronization block, said clock control block performing the comparing and the sending.

15. The method according to claim 13, further comprising a step of:
processing a binary input signal with a thermometer encoder to obtain said first data signal and said second data signal, said processing taking place in a thermometer encoder block prior to the data synchronization block.

16. The method according to claim 13, further comprising steps of:
providing a plurality of latches as said data synchronization block, each latch connected to a corresponding varactor in the varactor block;
grouping said latches into a plurality of groups, each group comprising a plurality of the latches; and
providing a plurality of clock control blocks, each corresponding to one of said groups of latches, for comparing data of the second data signal with data of the first data signal to determine whether there is a change.

17. The method according to claim 13, further comprising a step of:
storing the first input signal in a clock control block for one clock cycle for carrying out the comparing.

18. A digital varactor system, comprising:
a varactor array having a plurality of varactors;
a plurality of latches, each said latch connected to one of the varactors in the varactor array, said latches being grouped into a plurality of groups, each group comprising a plurality of the latches;
a main thermometer encoder for receiving data signals and performing thermometer encoding to produce a plurality of encoded latch input signals, wherein said encoded latch input signals are each passed to one of said latches for delivery to the connected varactor; and
a plurality of clock control blocks, each corresponding to a particular group of the latches, each said clock control block storing a first data signal corresponding to a first point in time and comparing data of the first data signal with data of a second data signal corresponding to a second point in time for determining to pass a clock signal to the particular group of latches in connection with the second data signal based on whether there is a change between the data of the first data signal and the data of the second data signal.

19. The system according to claim 18, further comprising:
a flip-flop circuit in said clock control block for storing the data of the first data signal for one clock cycle to enable comparison of the data of the first data signal with the data of the second data signal.

20. The system according to claim 18, further comprising:
a first secondary thermometer encoder and a second secondary thermometer encoder in said clock control block for carrying out thermometer encoding of the stored first data signal and the second data signal to enable comparison of the data of said first data signal with the data of said second data signal.

* * * * *